(12) United States Patent
Kunst et al.

(10) Patent No.: US 6,897,662 B2
(45) Date of Patent: May 24, 2005

(54) METHOD AND APPARATUS FOR OPTIMIZING THE ACCURACY OF AN ELECTRONIC CIRCUIT

(75) Inventors: David J. Kunst, Cupertino, CA (US); Charles L. Vinn, Milpitas, CA (US)

(73) Assignee: Micrel, Incorporated, San Jose, CA (US)

( * ) Notice: Subject to any disclaimer, the term of this patent is extended or adjusted under 35 U.S.C. 154(b) by 242 days.

(21) Appl. No.: 10/045,416

(22) Filed: Oct. 26, 2001

(65) Prior Publication Data

US 2003/0080759 A1 May 1, 2003

(51) Int. Cl.[7] ............................................. G01R 27/08
(52) U.S. Cl. ..................................... 324/713; 324/767
(58) Field of Search ................................ 324/713, 522, 324/767, 430, 602, 609, 705; 323/315, 316

(56) References Cited

U.S. PATENT DOCUMENTS

| | | | | |
|---|---|---|---|---|
| 4,041,388 A | * | 8/1977 | Arnoldi et al. | 324/767 |
| 5,059,916 A | * | 10/1991 | Johnson | 324/713 |
| 5,877,617 A | * | 3/1999 | Ueda | 323/316 |
| 6,130,541 A | * | 10/2000 | Ozguc | 324/678 |
| 6,246,243 B1 | * | 6/2001 | Audy | 324/550 |
| 6,343,024 B1 | * | 1/2002 | Zabroda | 363/22 |
| 2002/0063573 A1 | * | 5/2002 | Genova et al. | 324/769 |
| 2004/0227539 A1 | * | 11/2004 | Thiery | 324/769 |

* cited by examiner

Primary Examiner—Anjan K. Deb
(74) Attorney, Agent, or Firm—Dorsey & Whitney LLP

(57) ABSTRACT

The present invention provides an apparatus and method for improving the accuracy of circuits. The apparatus includes a replicate circuit and a trim determination circuit. The trim determination circuit includes a measurable circuit element and determines the state of the measurable element. The replicate circuit includes a replicate circuit element which has similar electrical characteristics as the measurable element, and is configured to aid in determining an adjustable test current. The trim determination circuit generates a test current which is proportional to the adjustable test current. The test current is passed through the measurable element such that a first voltage drop occurs across the measurable element. A measured current is generated at a current level dictated by the voltage drop across the measurable element, such that the state of the measurable element is determined by the difference between the measured current and a scaled reference current.

39 Claims, 6 Drawing Sheets

METHOD AND APPARATUS FOR OPTIMIZING THE ACCURACY OF AN ELECTRONIC CIRCUIT

TECHNICAL FIELD

This invention pertains to optimizing the accuracy of an electronic circuit, and more particularly to a method and apparatus for determining the impedance of a circuit element having variable impedance.

BACKGROUND

Improving the accuracy of circuit has been a requirement of analog circuits for a number of years. Zener zap trimming (both in the reverse and forward mode) has been used for years in improving the accuracy of circuits by adding or removing parallel impedances. Zener diodes operating in an untrimmed state act substantially as an open circuit. However, when sufficient amounts of current are supplied to a zener diode, the diode can be trimmed so as to close the open circuit and provide a reduced impedance across the zener diode. Adding these trimmed zener diodes in parallel allows the fine tunning of impedances on an electronic circuit. Other methods used for improving accuracy include metal link and poly link blowing. However, as technology and the semiconductor industry shifts towards submicron processes, the techniques for trimming zener diodes are not available or do not provide effective results.

However, a device called a degenerative zener diode has been developed which may be available in submicron processing. This PN diode structure acts as a high value resistor when it is in an untrimmed state and a low value resistor once a large (i.e., 100 mA) current has been passed through the zener. Circuitry surrounds this structure which senses whether the high or low resistance mode of the zener exists and uses this knowledge to selectively adjust the performance of analog circuits.

In prior art techniques for trimming degenerate zener diodes, a fixed current from a current source flows through the degenerate zener diode. If the voltage drop exceeds a given threshold, then the degenerate zener diode is considered untrimmed and no discrete changes are made to the circuitry requiring precision enhancement. Conversely, if the voltage is less than the threshold, then the degenerate zener is trimmed and a discrete change to the accuracy is permanently incorporated.

The problem with the prior art techniques is that the impedance of the degenerative zener diode in the untrimmed mode is not well defined and varies. Further, the impedance of untrimmed degenerative zener diodes are sensitive to semiconductor process variations resulting in variations in the impedance. This variation results in false determinations of the state of the degenerative zener diode and thus results in incorrect adjustments in the accuracy of circuits employing degenerative zener diodes.

SUMMARY

The present invention provides an apparatus and method for improving the accuracy of circuits. In one embodiment, the accuracy is improved by determining a state of a measurable element, where the measurable element has a plurality of states such that the measurable element has a different impedance in each state. The apparatus includes a replicate circuit and a trim determination circuit, wherein the trim determination circuit includes the measurable element. The trim determination circuit determines the state of the measurable electronic circuit element. The replicate circuit includes a replicate element. The replicate element has similar electrical characteristics as the measurable element. The replicate element aids in determining an adjustable test current. The trim determination circuit generates a test current which is proportional to the adjustable test current. The test current is passed through the measurable element such that a first voltage drop occurs across the measurable element proportional to the impedance of the measurable element. In one embodiment, the trim determination circuit further includes a scaled reference current source configured to generate a scaled reference current, and a dependent measurable current source coupled with the scaled reference current source. The dependent measurable current source generates a measured current, wherein the level of the measured current is dictated, at least in part, by the first voltage drop, such that the state of the measurable element is determined by the difference between the scaled reference current and the measured current.

In one embodiment, the trim determination circuit includes a first amplifier, wherein the measurable element couples with a first input of the first amplifier. The test current passes through a measurable element such that the first input of the first amplifier receives a measured voltage proportional to a first voltage drop across the measurable element. A first sense voltage is coupled with a second input of the first amplifier, and the first amplifier generates an output proportional to the difference between the measured voltage and the first sense voltage. The replicate circuit includes a replicate element. The replicate element has similar electrical characteristics as the measurable element, wherein the replicate element couples with an adjustable test current source such that the adjustable test current passes through the replicate element resulting in a second voltage drop across the replicate element. The replicate circuit further includes a second amplifier, wherein the replicate element couples with a first input of the second amplifier. The first input of the second amplifier receives a replicate voltage proportional to the second voltage drop across the replicate element. The second amplifier has second input which receives a second sense voltage, and an output which couples with the adjustable test current source and controls the level of the adjustable test current.

BRIEF DESCRIPTION OF THE DRAWINGS

The invention, together with further advantages thereof, may best be understood by reference to the following description taken in conjunction with the accompanying drawings in which.

DETAILED DESCRIPTION

The present invention provides a method and apparatus for improving the accuracy of electronic circuits. In one embodiment, the present invention is capable of accurately determining the impedance level or state of a device or component within an electronic circuit, where the device has a plurality of states such that in each state the device has a different impedance. One example of a device having a variable impedance is a degenerative zener diode. It is known that a degenerative zener diode has a first impedance when in an untrimmed state and a second, lower impedance when in a trimmed state. However, the first and second impedance values can also vary between different degenerative zener diodes due to semiconductor processing variations. Thus, in one embodiment, the present invention provides a method and apparatus for accurately determining the state of a degenerative zener diode, trimmed or untrimmed, regardless of the variation in the impedance values. The accurate determination of the state of the zener diode allows circuitry to selectively trim degenerate zener diodes to improve the accuracy of a circuit. The method and apparatus of the present invention achieves this improved accuracy through the use of an adaptive current which adjusts for variations in zener diode impedance. Thus the present invention solves the problem of accurately sensing or determining the state of the electronic device having two or more states, where the impedance of the device is different for each state. More specifically, the present invention solves the problem of determining the state of a degenerative zener diode given a potentially large variation in untrimmed impedance. Thus, by being able to accurately determine the state of a degenerative zener diode, the accuracy of a circuit employing degenerative zener diodes is greatly enhanced.

Figure 1:
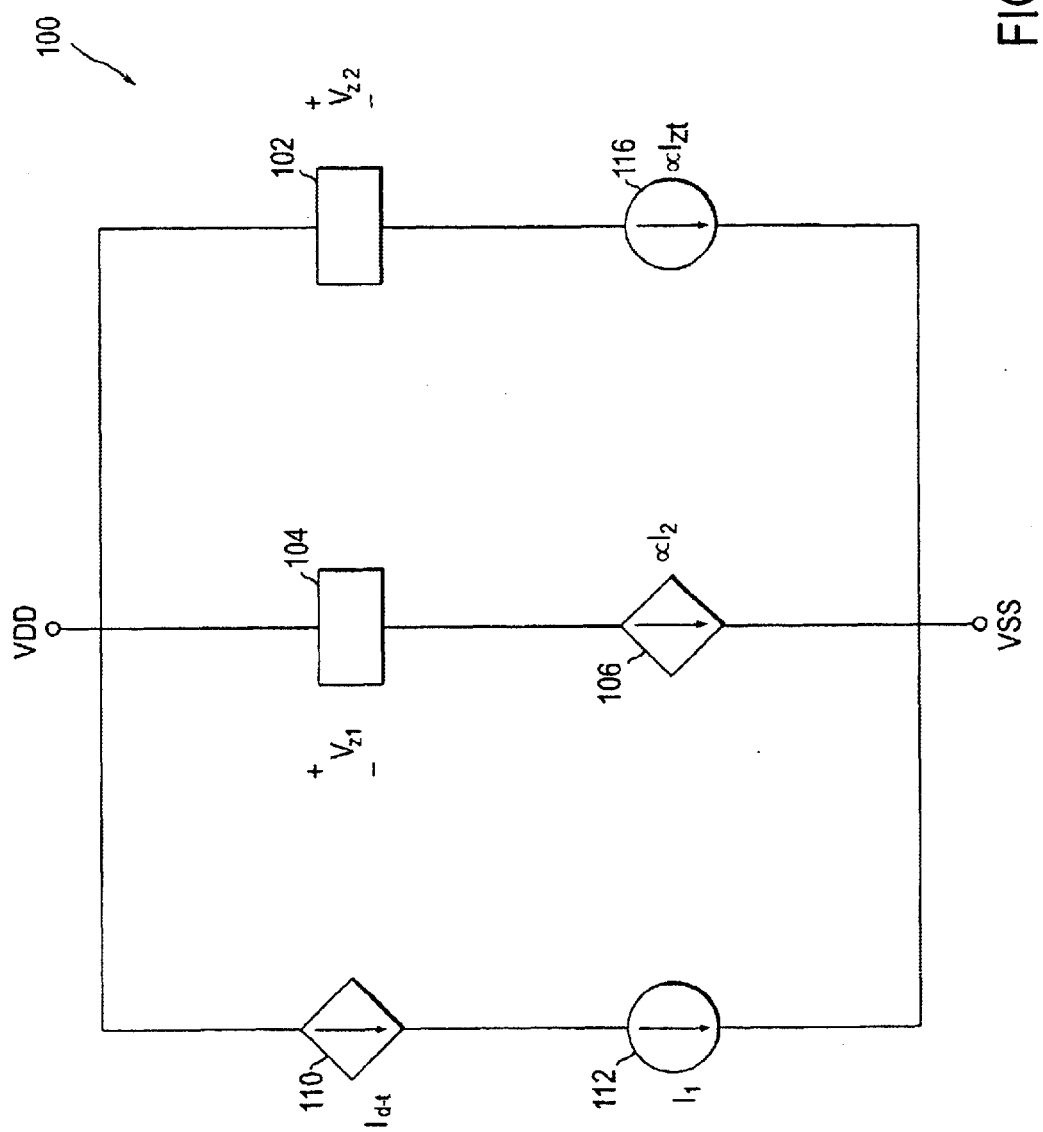
FIG. 1 depicts a simplified schematic diagram of one implementation of one embodiment of the circuit accuracy apparatus of the present invention.

FIG. 1 depicts a simplified schematic diagram of one implementation of one embodiment of the circuit accuracy apparatus 100 of the present invention. The apparatus includes a measurable electronic device or element 102, such as a degenerative zener diode, having two or more states with a different impedance in each state. The apparatus is configured to at least determine the state of the measurable element 102. As discussed above, a degenerative zener diode includes an untrimmed state with a relatively large impedance, and a trimmed stated with a relatively small impedance compared with the large untrimmed impedance. The apparatus includes a replicate element 104 which has substantially identical electrical characteristics as the measurable element 102. Further, the state of the replicate element is known. The replicate element couples with an adjustable test current source 106 which supplies an adjustable test current $\alpha I_2$ that passes through the replicate element and generates a voltage drop $V_{z1}$ across the replicate element. The apparatus 100 further includes a threshold dependent current source 110 which couples with a reference current source 112 generating a reference current $I_1$. The threshold dependent current source 110 generates a threshold current $I_{d-t}$ which is dependent on the voltage drop $V_{z1}$ across the replicate element 104. The adjustable test current $\alpha I_2$ supplied by the adjustable test current source 106 is dependent on the difference between the threshold current $I_{d-t}$ and the reference current $I_1$. Feedback is provided which includes at least the replicate element 104, the dependent adjustable test current source 106 and the dependent threshold current source 110. If a difference exists between the threshold current $I_{d-t}$ and the reference current $I_1$, the adjustable test current source 106 adjusts the adjustable test current $\alpha I_2$ to cause a shift in the voltage drop $V_{z1}$ across the replicate element 104. The change in the voltage drop $V_{z1}$ results in a shift of the threshold current $I_{d-t}$ such that the threshold current again equals the reference current $I_1$.

A test current source 116 couples with the measurable element 102 and generates a test current $\alpha I_{2t}$ which mirrors, and is thus substantially equal to the adjustable test current. The test current $\alpha I_{2t}$ passes through the measurable element resulting in a voltage drop $V_{z2}$ across the measurable element 102. Because the state of the replicate element 104 is known, the voltage drop $V_{z1}$ across the replicate element and the voltage drop $V_{z2}$ of the measurable element are compared to determine the state of the measurable element 102. The adjustments to the adjustable test current source 106 allows for the tunning or accurate determination of a threshold which is utilized to determine the state of the measurable element 102.

Figure 2:
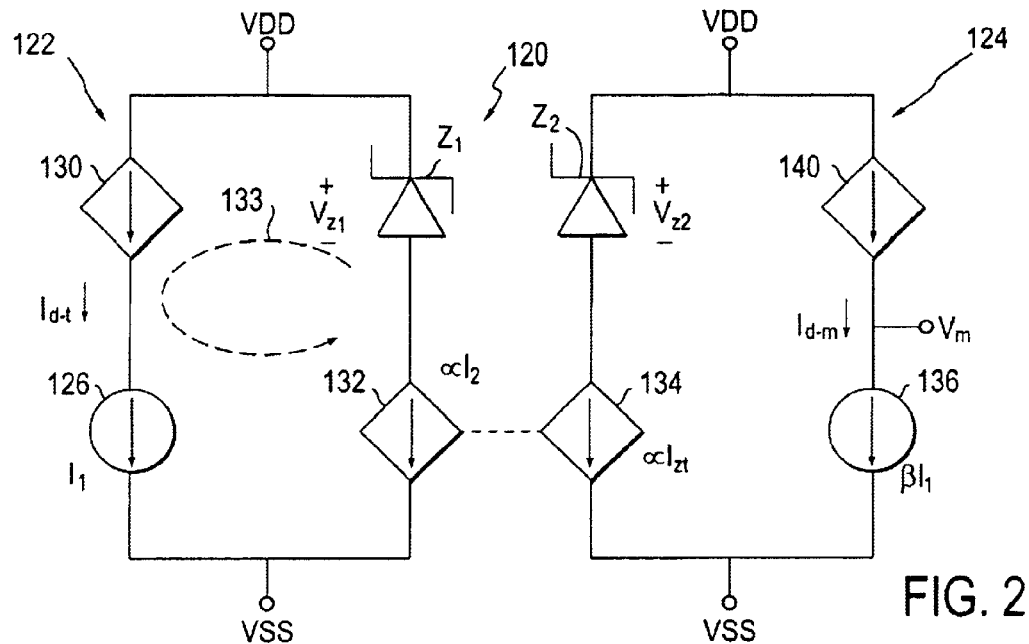
FIG. 2 depicts a simplified schematic diagram of one implementation of one embodiment of the apparatus providing the improved circuit accuracy.

FIG. 2 depicts a simplified schematic diagram of one implementation of one embodiment of the circuit accuracy apparatus 120 providing the improved circuit accuracy, The schematic diagram shown in FIG. 2 is a more detailed implementation of the schematic diagram of FIG. 1, however, it will be apparent to one skilled in the art that this is one example of one implementation and is not the only implementation. In one embodiment, the apparatus includes a replicate circuit 122 and a trim determination circuit 124. The replicate circuit 122 is configured, at least in part, to define an adjustable test current $\alpha I_2$ through a replicate electronic element, such as a replicate zener diode Z1, where the state of the replicate zener diode is known in the untrimmed state. In one embodiment, the replicate zener diode is a degenerative zener diode. The replicate circuit 122 further includes a reference current source 126 coupled with the dependent threshold current source 130. The reference current source supplies a reference current $I_1$, and the threshold circuit source generates threshold current $I_{d-t}$ where the threshold current is dependent upon the voltage drop $V_{z1}$ across the replicate zener diode Z1. The adjustable test current $\alpha I_2$ is dependent upon the difference between the reference current $I_1$ and the threshold current $I_{d-t}$. Thus a feedback 133 is established through the cooperation between the adjustable test current source 132, the threshold current source 130 and the replicate zener diode Z1. The threshold current source 130 aids in establishing a threshold which is utilized in determining the state of a measurable zener diode Z2. In one embodiment, the adjustment factor $\alpha$ is proportional to the difference between the threshold current $I_{d-t}$ and the reference current $I_1$.

In one embodiment, the adjustable test current $\alpha I_2$ is adjusted such that the threshold current $I_{d-t}$ is maintained at a current level equal to the reference current $I_1$. If the threshold current $I_{d-t}$ exceeds the reference current $I_1$, the adjustable test current $\alpha I_2$ adjusts to reduce the voltage $V_{z1}$ across the replicate zener diode Z1 which in turn affects the dependent threshold current source 130 resulting in a reduction in the threshold current $I_{d-t}$. If the threshold current $I_{d-t}$ is less than the reference current $I_1$, the adjustable test current $\alpha I_2$ adjusts to increase the voltage $V_{z1}$ across the replicate zener diode Z1, resulting in an increased threshold current $I_{d-t}$.

The adjustable test current $\alpha I_2$ establishes a voltage $V_{z1}$ across the replicate zener This voltage $V_{z1}$ is dependent on the state of the replicate zener diode, whether trimmed, resulting in a relatively lower impedance, or untrimmed, resulting in an impedance that is relatively large compared with the impedance in a trimmed state. In one embodiment, the replicate zener diode is maintained in an untrimmed state.

In one embodiment, the trim determination circuit 124 includes a mirror test current source 134 which mirrors the adjustable test current $\alpha I_2$ to produce a test current $\alpha I_{2t}$ substantially equal to the adjustable test current. The mirror test current source 134 couples with at least a measurable electronic element in which the state is to be determined, such as a degenerative zener diode Z2. In one embodiment, the measurable zener diode Z2 has substantially identical electrical characteristics as the replicate zener diode Z1. In one embodiment, the replicate circuitry 122 and the trim determination circuitry 124 are generated on the same semiconductor chip through the same semiconductor processing. As is known in the art, similar components generated through the same semiconductor processing and occurring on the same semiconductor chip generally have substantially identical characteristics. As such, in one embodiment, the replicate and measurable zener diodes Z1, Z2 are substantially identical. Because the replicate and measurable zener diodes are substantially identical, and because the currents passing through each of the replicate and measurable zener diodes is substantially the same, $\alpha I_2$, the voltage resulting across both the replicate and measurable zener diodes will be substantially identical if both diodes are trimmed, or both are untrimmed.

The trim determination circuitry 124 further includes a scaled reference current source 136 providing a scaled reference current $\beta I_1$ which is directly proportional to the reference current $I_1$ of the replicate circuitry 122. In one embodiment, the scaled reference current is scaled by a scaling factor $\beta$ to provide a margin of error in determining the state of the measurable zener diode Z2. The scaled reference current source 136 couples with a dependent measurable current source 140. In one embodiment, the measurable current source 140 is substantially identical to the threshold current source 130, and thus has substantially identical electrical characteristics. The dependent measurable current source 140 generates a measurable current $I_{d-m}$ which is dependent on the voltage drop $V_{z2}$ across the measurable zener diode Z2, thus, the voltage $V_{z2}$ across the measurable zener diode dictates the current level of the measurable current $I_{d-m}$. A measured voltage $V_m$ results due to the difference between the measured current $I_{d-m}$ and the scaled reference current $\beta I_1$. In one embodiment, a measured voltage $V_m$ is utilized in accurately determining the state of the measurable zener diode Z2 is trimmed or untrimmed.

For example, assuming the replicate zener diode Z1, and the measurable zener diode Z2 are untrimmed, thus both diodes have substantially equal and relatively high impedances. Further, as the currents passing through each of the replicate and measurable zener diodes are substantially equal, $\alpha I_2$, the voltage drops across each diode, $V_{z1}$ and $V_{z2}$, respectively, are substantially equal. Because the voltages $V_{z1}$ and $V_{z2}$ are substantially equal, the dependent currents of the threshold and measurable current sources 130 and 140 are also substantially equal, resulting in substantially equal threshold and measurable currents, $I_{d-t}$ and $I_{d-m}$ Recalling that the threshold current $I_{d-t}$ is maintained at a level equal to the reference current $I_1$, and because the scaled reference current source 136 is scaled by the scaling factor $\beta$, the measured current $I_{d-m}$ from the measurable transistor 140 will not be equal to the scaled reference current $\beta I_1$ supplied by the scaled reference current source 136. Thus, the measured voltage $V_m$ at the lower voltage potential side or terminal of the measurable current source will adjust depending on the difference between the measured current $I_{d-m}$ and the scaled reference current $\beta I_1$, resulting in a high or low output which distinguishes between the threshold levels of the measurable zener diode Z2 and provides for an accurate determination of the state of the measurable zener diode Z2.

Further, assuming the replicate and measurable zener diodes Z1, Z2 are untrimmed, and the scaled reference current $\beta I_1$, is less than the reference current $I_1$, the voltage across the zener diodes $V_{z1}$, $V_{z2}$ and thus the voltages from which the threshold and measurable current sources 130, 140 depend are substantially equal, resulting in a measurable current $I_{d-m}$ equal to the reference current $I_1$. Because the scaled reference current source 136 supplies a scaled current $\beta I_1$ which is less than the reference current $I_1$, the measured voltage $V_m$ will rise towards the positive supply voltage VDD, resulting in a clear high state. Because it is known that the replicate zener Z1 is untrimmed, it is known that a high state of the measured voltage $V_m$ clearly designates that the measurable zener diode Z2 is also untrimmed.

As an alternative example, assume the replicate zener Z1 is untrimmed, and the measurable zener diode Z2 is trimmed. Because the impedance of the measurable zener Z2 is relatively small compared with the impedance of the untrimmed state, the voltage $V_{z2}$ across the measurable zener diode Z2, defined by the test current $\alpha I_2$ supplied by the mirror test current source 134, will be significantly lower than the voltage $V_{z1}$ of the replicate zener diode Z1. The relatively small measurable zener voltage $V_{z2}$ defines the dependent voltage of the measurable current source 140. Because the dependent voltage of the measurable current source 140 is small, the current source will not turn on to supply the measurable current $I_{d-m}$ or the measurable current $I_{d-m}$ will be small compared with the scaled reference current $\beta I_1$ causing the measured voltage $V_m$ to shift towards ground or the negative reference voltage VSS, resulting in a low state. The low state clearly designates that the measurable zener diode Z2 is in a trimmed state.

Figure 3:
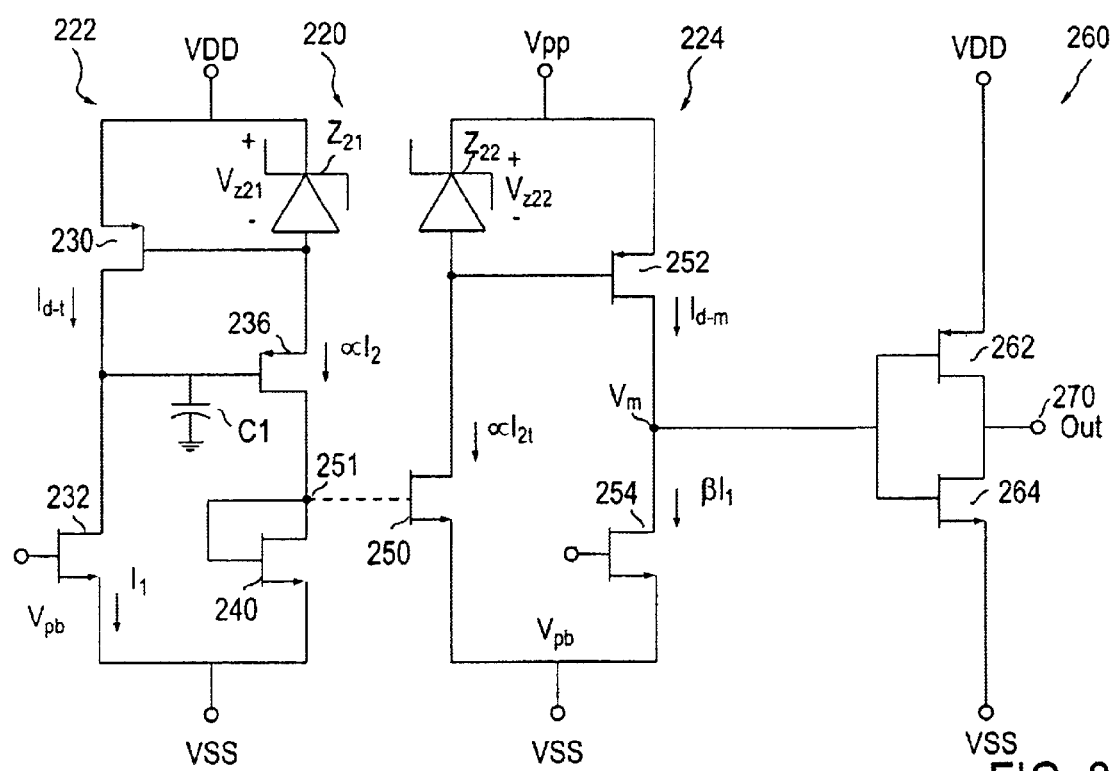
FIG. 3 depicts a simplified schematic diagram of one implementation of one embodiment of the circuit accuracy apparatus of the present invention.

FIG. 3 depicts a simplified schematic diagram of one implementation of one embodiment of the circuit accuracy apparatus 220 of the present invention. The schematic diagram shown in FIG. 3 is a more detailed implementation of the schematic diagram of FIG. 2, however, it will be apparent to one skilled in the art that this is one example of one implementation and is not the only implementation. The apparatus 220 includes a replication circuit 222 and a trim determination circuit 224. In one embodiment, the replication circuit 222 includes a threshold transistor 230 and a reference current source transistor 232. The drain of the threshold transistor 230 couples with the drain of the reference current source transistor 232. The gate of the reference current source transistor couples with a voltage potential Vpb to establish a gate to source voltage such that the reference current source transistor supplies a reference current $I_1$. The replication circuit 222 further includes a replicate element, such as a replicate degenerative zener diode Z21, coupled between a first positive voltage source VDD and a source of an adjustable test current source transistor 236. The adjustable test current source transistor 236 generates an adjustable test current $\alpha I_2$ which passes through the replicate zener diode Z21 resulting in a voltage drop $V_{z21}$ across the replicate zener diode Z21. The gate of the threshold transistor 230 couples between the replicate zener diode Z21 and the adjustable test current source transistor 236. Therefore, the gate to source voltage of the threshold transistor 230 is defined by, and is substantially equivalent to, the voltage drop $V_{z21}$ across the replicate zener diode Z21. The drain of the adjustable test current source transistor 236 couples with the drain of a first current mirror transistor 240 which mirrors the adjustable test current $\alpha I_2$. The gate of the adjustable test current source transistor 236 couples to the drain of the threshold transistor 230 and the drain of the reference current source transistor 232. A capacitor C1 couples between the gate of the adjustable test current transistor 236 and a low reference voltage or ground VSS.

In one embodiment, the adjustable test current $\alpha I_2$ is dependent on the difference between the threshold transistor drain current $I_{d\text{-}t}$ and the reference current $I_1$. If the threshold current $I_{d\text{-}t}$ is less than the reference current $I_1$, the reference current source transistor 232 discharges the capacitor C1 causing the voltage at the gate of the adjustable test current source transistor 236 to drop. The drop in voltage at the gate of the adjustable test current source transistor 236 results in an increased gate to source voltage. As the gate to source voltage of the adjustable test current source transistor increases, the adjustable test current $\alpha I_2$ increases, resulting in an increased voltage drop $V_{z21}$ across the replicate zener diode Z21. The increased voltage drop $V_{z21}$ across the zener diode Z21 results in an increased gate to source voltage of the threshold transistor 230 and in an increased threshold transistor current $I_{d\text{-}t}$, and thus reduces the difference between the threshold current $I_{d\text{-}t}$ and the reference current $I_1$. If the threshold current $I_{d\text{-}t}$ is greater than the reference current $I_1$, the excess current charges the capacitor C1 increasing the voltage at the gate of the adjustable test current source, reducing the gate to source voltage of the adjustable test current source transistor 236, causing a reduction in the adjustable test current $\alpha I_2$ which in turn causes a reduction in the voltage drop $V_{z21}$ across the replicate zener diode Z21. The decreased voltage drop V21 reduces the gate to source voltage of the threshold transistor, reducing the threshold current $I_{d\text{-}t}$, thus reducing the difference between the threshold current $I_{d\text{-}t}$ and the reference current $I_1$. Ultimately, $I_{d\text{-}t}$ settles at approximately $I_1$, and $\alpha I_2$ equals the gate to source voltage of the threshold transistor 230 divided by the impedance of zener diode Z21.

Still referring to FIG. 3, in one embodiment, the trim determination circuitry 224 includes a second mirror transistor 250. The gate of the second mirror transistor 250 couples with the same voltage potential 251 as the gate of the first mirror transistor 240, such that the second mirror transistor 250 provides a test current $\alpha I_{2t}$ which is substantially equal to the adjustable test current $\alpha i_2$. The drain of the second mirror transistor 250 couples with a measurable element, such as a measurable zener diode Z22, where the state of the measurable element is to be determined. In one embodiment, the measurable zener diode Z22 has substantially identical characteristics as the replicate zener diode Z21. The measurable zener diode Z22 couples between a second voltage source VPP and the drain of the second mirror transistor 250. The test current $\alpha I_{2t}$ generated by the second mirror current source transistor 254 is passed through the measurable zener diode Z22 resulting in a voltage drop $V_{z22}$ which is substantially equal to the voltage drop $V_{z21}$ of the replicate zener diode Z21. The gate of a measurable transistor 252 couples with the lower voltage potential side of the measurable zener diode Z22. In one embodiment, the measurable transistor 252 has substantially identical electrical characteristics as the threshold transistor 230. The source of the measurable transistor 252 couples with the second voltage source VPP. The drain of the measurable transistor 252 couples with the drain of a scaled reference current source transistor 254. In one embodiment, the gate of the scaled reference current source 254 couples with the same voltage potential Vpb as the reference current source 232 of the replicate circuitry 222 and thus has the same gate to source voltage as the reference current source transistor 232 and thus provides a scaled reference current $\beta I_1$ which is proportional to the reference current $I_1$ by a scaling factor $\beta$.

Because the gate of the measurable transistor 252 couples with the measurable zener diode Z22, the voltage drop $V_{z22}$ across measurable zener diode Z22 defines the gate to source voltage of the measurable transistor 252, and thus dictates a measurable current $I_{d\text{-}m}$ of the drain of the measurable transistor. Similar to the operation as described above, the measured voltage $V_m$ at the drain of the measurable transistor 252 is at a high or low state depending on the impedance of the measurable element, such as whether the measurable zener diode Z22 is trimmed or untrimmed. For example, assuming the replicate zener diode Z21 is untrimmed, the scaling factor is one third ($\beta = \frac{1}{3}$), and the measurable zener diode Z22 is untrimmed. The voltage $V_{z22}$ across the measurable zener diode causes the gate to source voltage of the measurable transistor to be sufficiently large to activate the measurable transistor 252 to drive the measurable current $I_{d\text{-}m}$. Because the measurable transistor 252 and the threshold transistor 230 are substantially similar, and both have substantially the same gate to source voltage, the measurable transistor 252 generates a measurable current $I_{d\text{-}m}$ which is substantially equal to the reference current $I_1$. Because the scaled reference transistor 254 generates a scaled reference current $\beta I_1$, the scaled reference current will not equal the measurable current $I_{d\text{-}m}$. In one embodiment, the measurable current $I_{d\text{-}m}$ is greater than the scaled reference current $\beta I_1$, by the scaling factor $\beta$, and thus the measured voltage $V_m$ at the drain of the measurable transistor will rise towards the second voltage source VPP.

In one embodiment, the scaling factor $\beta$ is generated by mismatching the actual number of transistors used to implement the reference current source transistor 232 and the scaled reference current source transistor 254. In one embodiment, the reference current source transistor 232 is implemented through three transistors coupled in parallel, while the scaled reference current source transistor 254 is implemented through a single transistor, thus, the scaled reference current $\beta I_1$ will be $\frac{1}{3}$ that of the reference current $I_1$.

Still referring to FIG. 3, in one embodiment, the apparatus 220 further includes a logic circuit 260 which receive the measured voltage $V_m$ of the measurable transistor 252 and toggles between a high and a low state depending on the state of the measurable zener diode Z22 as determined by the measured voltage $V_m$. The gate of a first logic transistor 262 and the gate of a second logic transistor 264 both couple with the drain of the measurable transistor 252. If the measured voltage $V_m$ is at a high voltage, the gate to source voltage of the second logic transistor 264 activates the second logic transistor and pulls the output 270 towards ground or the negative reference voltage VSS resulting in a logic low. If the measured voltage $V_m$ of the measurable transistor is at a low voltage, the gate to source voltage of the first logic transistor 262 activates the first logic transistor and pulls the output 270 towards the first reference VDD resulting in a logic high. In one embodiment, the logic circuitry 260 is an inverter.

In one embodiment, the threshold utilized to determine the state of the measurable zener diode Z2 is dictated by the difference between the measured current $I_{d\text{-}m}$ and the scaled reference current $\beta I_1$, and thus by the voltage level of the measured voltage $V_m$ at the drain of the measurable transistor.

Figure 4:
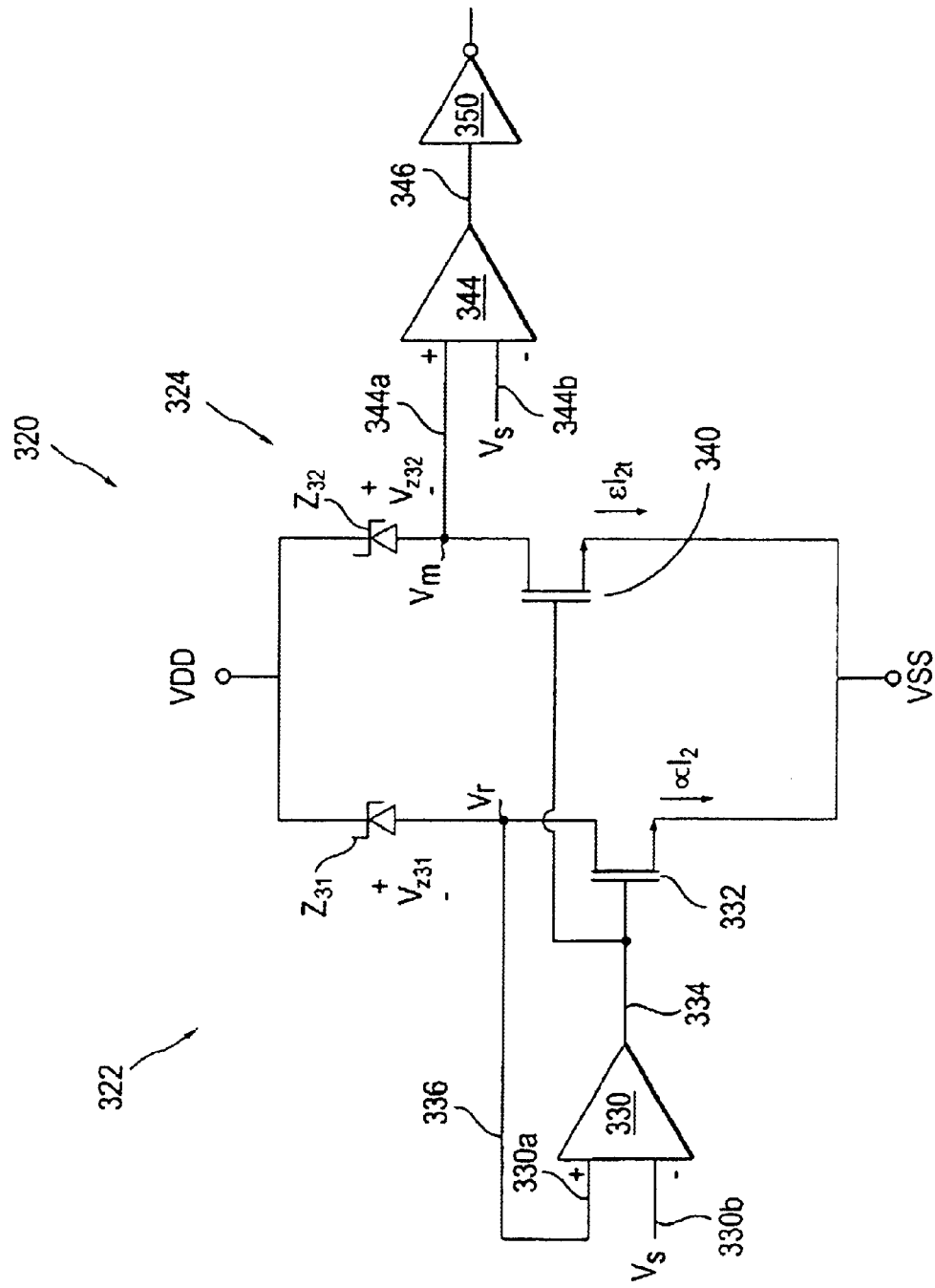
FIG. 4 depicts a simplified schematic diagram of one implementation of one embodiment of the accuracy circuit of the present invention, which includes a replicate circuit and a trim determination circuit.

FIG. 4 depicts a simplified schematic diagram of one implementation of one embodiment of the accuracy circuit 320 of the present invention, which includes a replicate circuit 322 and a trim determination circuit 324. The schematic diagram shown in FIG. 4 is a more detailed implementation of the schematic diagram of FIG. 1, however, it will be apparent to one skilled in the art that this is one example of one implementation and is not to be construed to limit the invention. The replicate circuit performs a similar function as described above in relation to FIGS. 2 and 3, to generate an adjustable test current $\alpha I_2$. The replicate circuit 322 includes a replicate amplifier 330 in which the output of the amplifier couples with the gate of an adjustable test current source transistor 332. The positive input 330a of the replicate amplifier couples with the lower voltage potential terminal of replicate zener diode Z31 and the drain of the adjustable test current source transistor 332 through a feedback loop 336. The negative input 330b of the replicate amplifier 330 receives a threshold or sense voltage Vs. The positive input of the replicate amplifier is forced to be substantially equal to Vs. Vs is set to be VDD/2, typically by a resistor divider from VDD. The adjustable test current source transistor 332 adjusts the adjustable test current $\alpha I_2$ to ensure the voltage drop $V_{z31}$ across the replicate zener diode Z31 results in a replicate voltage Vr which is substantially the same as the sense voltage Vs. If the adjustable test current $\alpha I_2$ is too small, the voltage $V_{z31}$ across the replicate zener diode Z31 decreases, causing the voltage at the positive input 330a of the replicate amplifier to rise towards the positive reference voltage VDD. If the positive input voltage increases above the sense voltage Vs, the amplifier output 334 voltage increases, causing an increase in the gate to source voltage of the adjustable test current source transistor 332 resulting in an increase in the adjustable test current $\alpha I_2$. The increased adjustable test current causes an increase in the replicate zener voltage $V_{z31}$ such that the positive input of the replicate amplifier 330 is reduced towards the sense voltage Vs. Alternatively, if the adjustable test current $\alpha I_2$ is too great, the voltage drop $V_{z31}$ across the replicate zener diode Z31 will increase, causing the voltage at the positive input of the replicate amplifier 330 to fall below the sense voltage Vs, resulting in a decrease in the replicate amplifier output 334. The decreased replicate amplifier output reduces the gate to source voltage of the adjustable source transistor 332, reducing the adjustable test current $\alpha I_2$, resulting in a reduced voltage drop $V_{z31}$ across the replicate zener diode Z31 and thus increasing the voltage at the positive input towards the sense voltage Vs.

Still referring to FIG. 4, the trim determination circuitry 324 includes a test current mirror transistor 340, a measurable zener diode Z32, and a determination amplifier 344. The gate of the test current mirror transistor 340 couples with the output 334 of the replicate. amplifier 330 such that the gate to source voltage of the test current mirror transistor 340 is substantially equal to the gate to source voltage of the adjustable test current source transistor 332, resulting in a scaled determination or test current $\epsilon I_{2t}$ which is directly proportional to the adjustable test current $\alpha I_2$ by a scaling factor $\epsilon$. The drain of the current mirror transistor 340 couples with the measurable zener diode Z32, such that the test current $\epsilon I_{2t}$ passes through the measurable zener diode resulting in a voltage drop $V_{z32}$ across the measurable zener diode Z32. The positive input 344a of the determination amplifier 344 couples between the measurable zener diode Z32 and the test current mirror transistor 340 to receive a measured voltage $V_m$ which is proportional to the voltage drop across the measurable zener diode. The negative input 344b of the determination amplifier 344 receives the threshold or sense voltage Vs. The determination amplifier generates an output 346 which is dependent on the voltage level of the measured voltage $V_m$, and thus dependent on the voltage drop $V_{z32}$ across the measurable zener diode Z32.

If the measurable zener diode is in an untrimmed state, the impedance is relatively large and thus produces a relatively large voltage drop $V_{z32}$ across the measurable zener diode Z32. As such, the voltage on the positive input of the determination amplifier 344 is less than the sense voltage Vs and produces a low output designating an untrimmed measurable zener diode Z32. If the measurable zener diode Z32 is trimmed, the impedance is relatively small resulting in a relatively small voltage drop $V_{z32}$. Because of the small voltage drop, the voltage at the positive input of the determination amplifier 344 is greater than the sense voltage Vs, thus the amplifier produces a high output signal designating a trimmed measurable zener diode Z32.

In one embodiment, the scaling factor $\epsilon$ is three, resulting in a voltage drop $V_{z32}$ across the measurable zener diode Z32 three time that of the drop $V_{z32}$ across the replicate zener diode Z31, further increasing the difference between the voltage levels of the trimmed and untrimmed states providing a margin of error. Thus, the voltage drop $V_{z32}$ will result in a voltage at the positive input of the determination amplifier 344 which is much less than the sense voltage Vs when the measurable zener diode is untrimmed. In one embodiment the scaling factor $\epsilon$ is generated by mismatching the number of transistors employed in realizing the adjustable test current transistor 332 and the test current mirror transistor 340.

In one embodiment, a logic device 350, such as an inverter, couples with the output 346 of the determination amplifier 344 to enhance the determination of the high or low state of the output 346 and thus the determination of the state of the measurable zener diode Z32.

Figure 5:
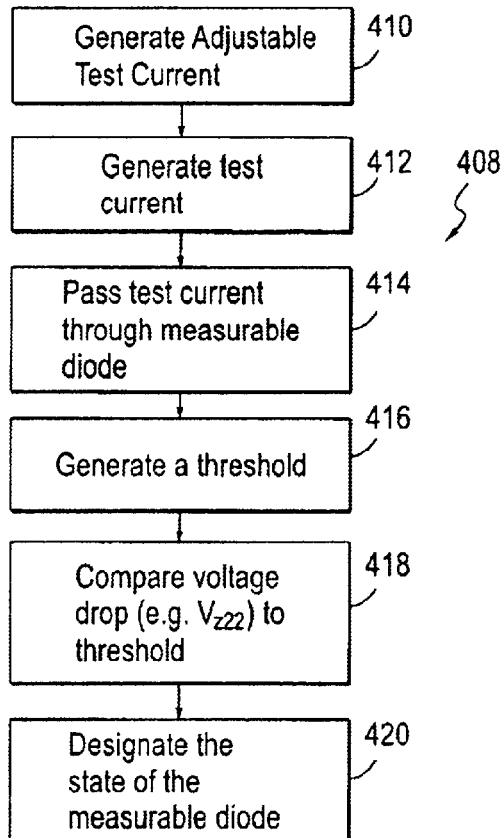
FIG. 5 depicts a flow diagram of one embodiment of a process for improving the accuracy of a circuit.

FIG. 5 depicts a flow diagram of one embodiment of a process 408 for improving the accuracy of a circuit. In step 410 an adjustable test current is generated. In step 412 a test current $\alpha I_2$ is generated mirroring the adjustable test current. For example, a test current $\alpha I_{2t}$ is generated as shown in FIG. 3. In step 414, the test current is passed through a measurable circuit element (e.g., a measurable diode Z22). In step 416, a threshold is generated. In step 418, a voltage drop $V_{z22}$ generated across the diode is compared to the threshold. In one embodiment, the threshold is a reference current (i.e., scaled reference current $\beta I_1$). In one embodiment, the threshold is a sense voltage. In step 420, the state of the diode is determined based on the comparison of the voltage drop $V_{z22}$ and the threshold.

Figure 6:
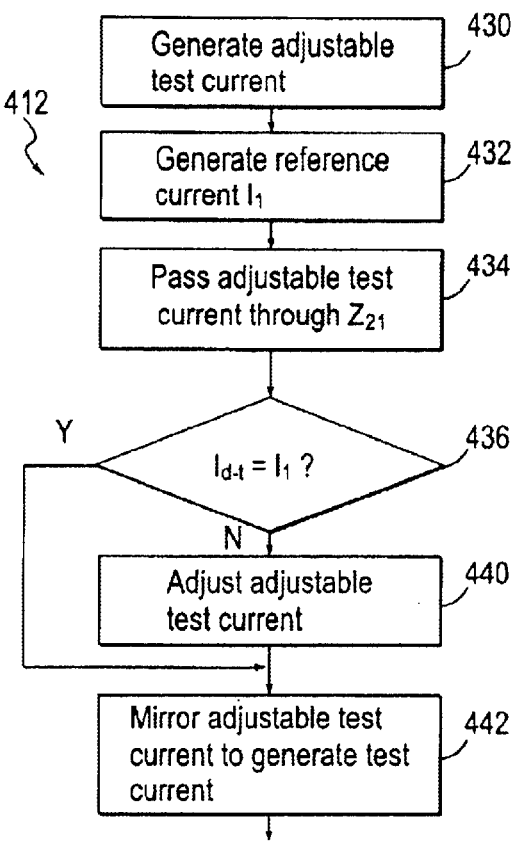
FIG. 6 depicts a flow diagram of one embodiment of a step performed in the process of FIG. 5 for generating the test current.

FIG. 6 depicts a flow diagram of one embodiment of the step 412 for generating the test current $\alpha I_{2t}$, for example as in the apparatus 220 shown in FIG. 3. In step 432, a reference current $I_1$ is generated. In step 434, the adjustable test current is passed through a replicate zener diode Z21. In step 436, it is determined if a threshold current $I_{d-t}$ is equal to the reference current $I_1$. If the threshold current $I_{d-t}$ is equal to the reference current, the process proceeds to step 442. If not, the process enters step 440 where the adjustable test current is adjusted to alter the voltage drop $V_{z21}$ across the replicate zener diode to effect a change in the threshold current $I_{d-t}$ such that the threshold current $I_{d-t}$ equals the reference current $I_1$. In step 442 the adjustable test current is mirrored to generate the test current $\alpha I_{2t}$.

Figure 7:
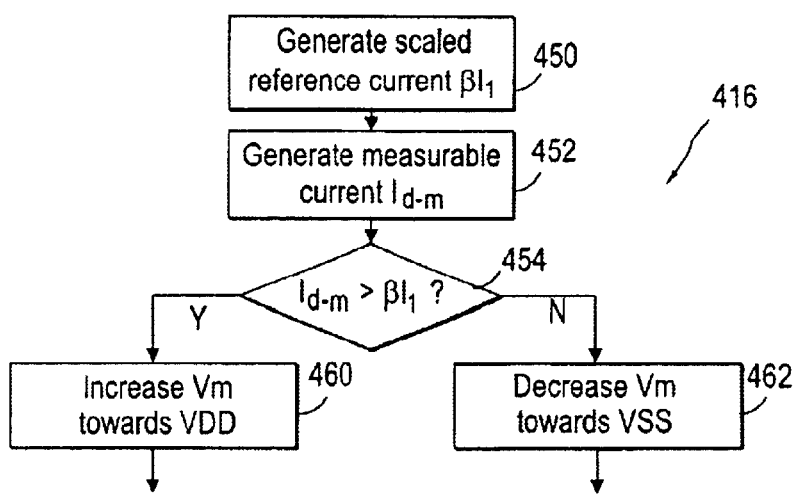
FIG. 7 depicts a flow diagram of one embodiment of a step of the process in FIG. 5 for comparing the voltage drop across the measurable diode to the threshold, where the threshold is a reference current.

FIG. 7 depicts a flow diagram of one embodiment of step 418 for comparing the voltage drop across the measurable element to the threshold, for example the voltage drop $V_{z22}$ in the apparatus 220 shown in FIG. 3, where the threshold is a reference current. In step 450, a scaled reference current $\beta I_1$ is generated. In step 452 a measurable current $I_{d-m}$ is generated based on the voltage drop $V_{z22}$ across the measurable diode. In step 454, it is determined if the measured current is greater than the scaled reference current. If the measured current $I_{d-m}$ is greater, then step 460 is entered where a first voltage level is generated representing a first state of the measurable diode. If, in step 454, it is determined that the measured current is not greater than the scaled reference current, a second voltage level is generated representing a second state of the measurable diode.

Figure 8:
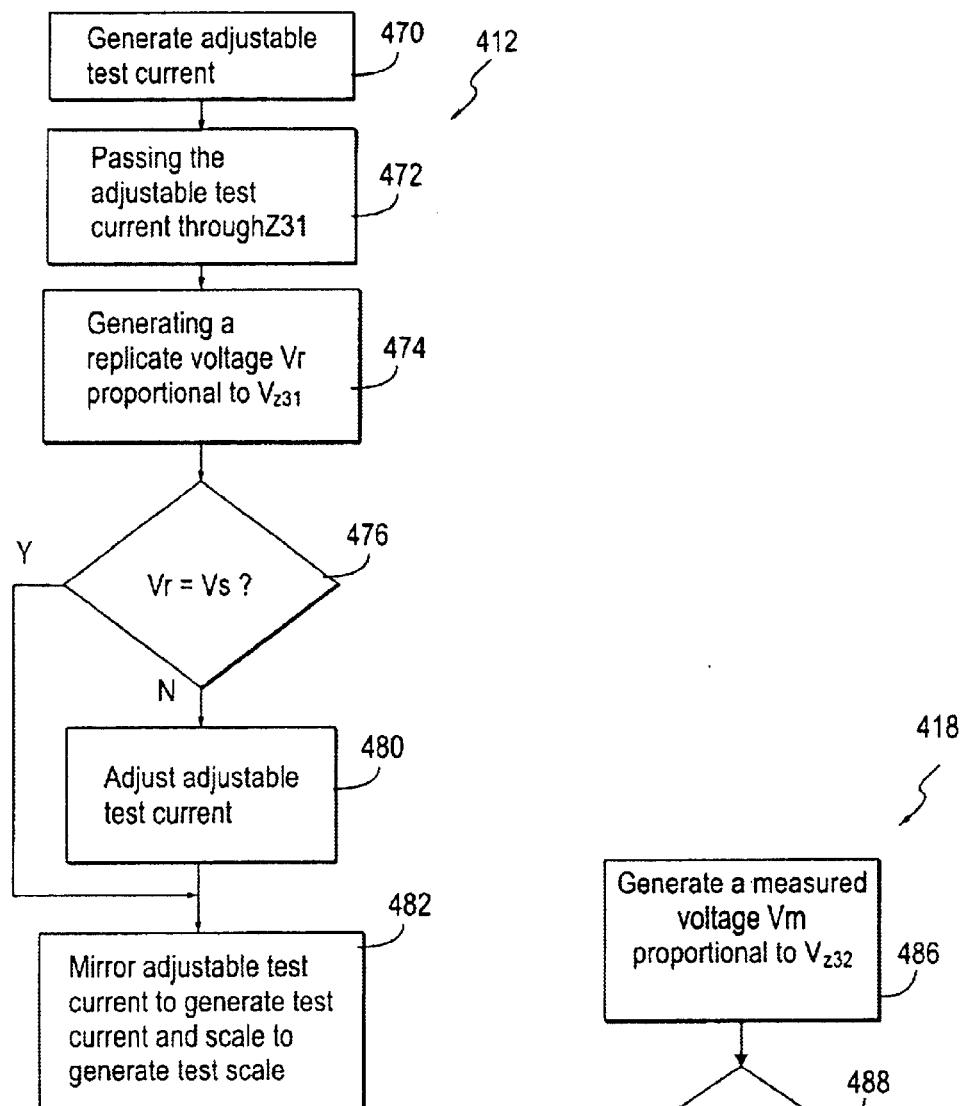
FIG. 8 depicts a flow diagram of one embodiment of a step performed in the process of FIG. 5 for generating the test current.

FIG. 8 depicts a flow diagram of one embodiment of the step 412 for generating the test current $\alpha I_{2t}$, for example in the accuracy circuit 320 in FIG. 4. In step 470, an adjustable test current $\alpha I_2$ is generated. In step 472, the adjustable test current is passed through a replicate zener diode Z31 resulting in a voltage drop $V_{z31}$ across the replicate zener diode. In step 474, a replicate voltage $V_r$ proportional to the voltage drop $V_{z31}$ across the replicate zener diode is generated. In step 476, it is determined if the replicate voltage $V_r$ is equal to a sense voltage Vs. If the replicate voltage equals the sense voltage the process proceeds to step 482. If the replicate voltage does not equal the sense voltage, the adjustable test current $\alpha I_2$ is adjusted in step 480 to alter the voltage drop $V_{z31}$ across the replicate zener diode Z31 to adjust the replicate voltage $V_r$ to equal the sense voltage. In step 482, the adjustable test current is mirrored and scaled to generate the test current $\epsilon I_{2t}$.

Figure 9:
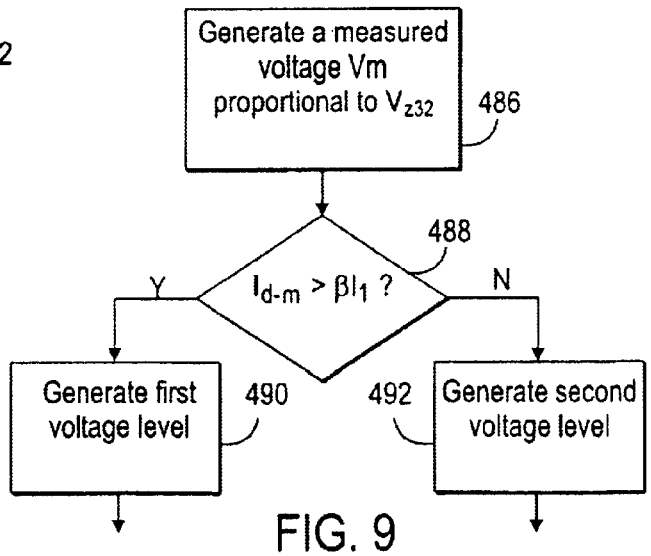
FIG. 9 depicts a flow diagram of one embodiment of a step preformed in the process of FIG. 5 for comparing the voltage drop across the measurable diode to the threshold, where the threshold is a sense voltage.

FIG. 9 depicts a flow diagram of one embodiment of step 418 of FIG. 5, for example with respect to accuracy circuit 320 of FIG. 4, for comparing the voltage drop $V_{z32}$ across the measurable diode Z32 to the threshold, where the threshold is a sense voltage. In step 486, a measured voltage $V_m$ is generated which is proportional to the voltage drop $V_{z32}$ across the measurable zener diode Z32. In step 488, it is determined if the measured voltage $V_m$ is greater than the sense voltage Vs. If the measured voltage is greater, then step 490 is entered where a first voltage level is generated representing a first state of the measurable zener diode Z32. If the measured voltage $V_m$ is not greater than the sense voltage Vs, then step 492 is entered where a second voltage level is generated representing a second state of the measurable zener diode.

Figure 10:
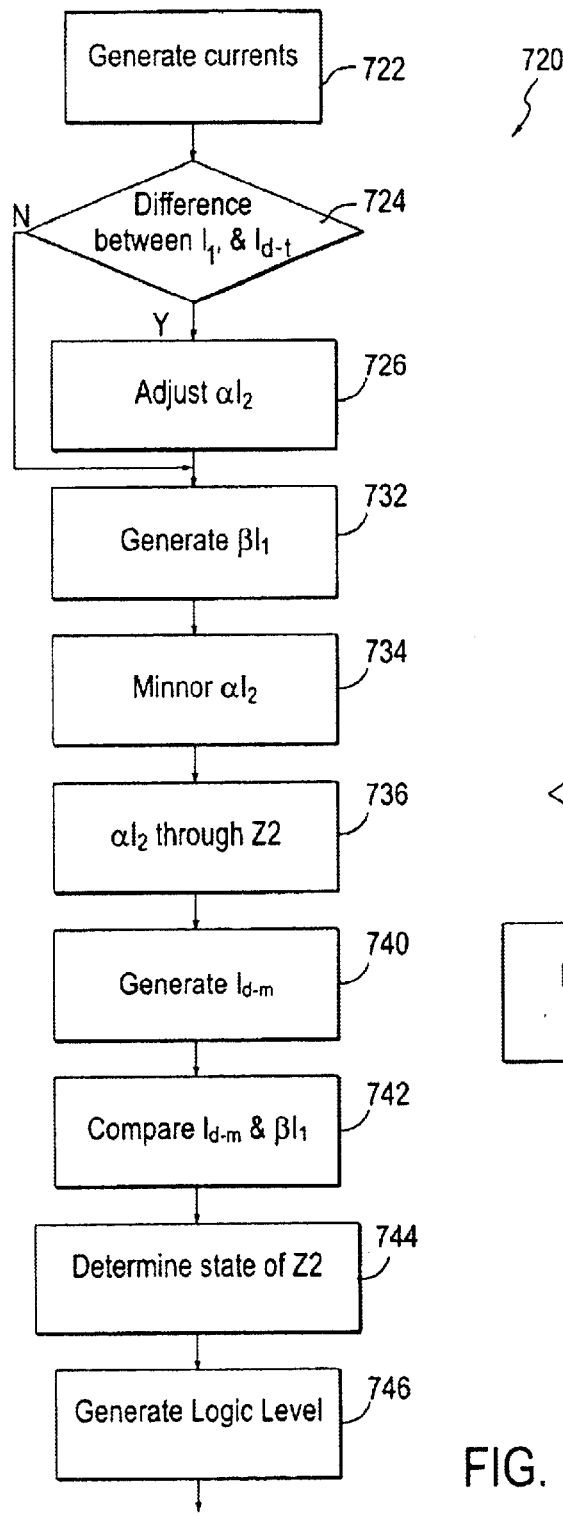
FIG. 10 depicts a simplified flow diagram of one implementation of a process for improving circuit accuracy and determining a state of at least one circuit element having a plurality of states where the circuit element has a different impedance when in each state.

FIG. 10 depicts a simplified flow diagram of one implementation of a process 720 for improving circuit accuracy, for example with respect to circuit accuracy apparatus 120 of FIG. 2, and determining a state of at least one circuit element having a plurality of states, where the circuit element has a different impedance in each state. In step 722, a reference current $I_1$, a threshold current $I_{d-t}$ and an adjustable test current are generated. In step 724, it is determined whether there is a difference between the reference current $I_1$ and the threshold current $I_{d-t}$. In one embodiment, the voltage drop across a replicate circuit element controls the level of the threshold current. Adjustments to the adjustable test current causes changes in the voltage drop across the replicate circuit element resulting in adjustments to the threshold current $I_{d-t}$. If there is not a difference between the reference current $I_1$ and the threshold current $I_{d-t}$, the process 720 proceeds to step 732. If there is a difference between the reference current $I_1$ and the threshold current $I_{d-t}$, step 726 is entered where the adjustable current $\alpha I_2$ is adjusted or adapted based on the difference between the reference current and the threshold current.

In step 732, a scaled reference current $\beta I_1$ is generated. In step 734, the adjustable test current $\alpha I_2$ is mirrored to generate a test current $\alpha I_{2t}$. In step 736, the test current $\alpha I_{2t}$ is passed through a measurable circuit element Z2 resulting in a voltage drop across the measurable circuit element proportional to the impedance of the measurable circuit element. In step 740, a measured current $I_{d-m}$ is generated which is controlled, at least in part, by the voltage drop $V_{z2}$ across the measurable circuit element. In step 742, the measured current $I_{d-m}$ is compared with the scaled reference current $\beta I_1$. In step 744, the state of the measurable circuit element is determined based on the voltage generated as a result of the difference between the measurable current $I_{d-m}$ and the scaled reference current $\beta I_1$. In step 746, a logic level is generated based on the state of the measurable circuit element.

Figure 11:
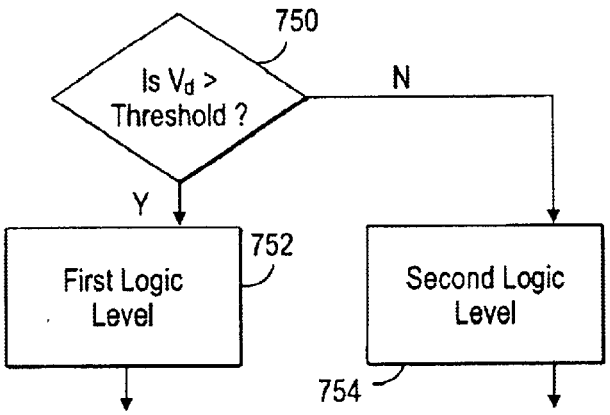
FIG. 11 depicts one implementation of one embodiment of steps preformed in the process described and depicted in relation to FIG. 10.

FIG. 11 depicts one implementation of one embodiment of steps 744 and 746 of the process 720 described above and depicted in FIG. 10, which can be used for example with circuit accuracy apparatus 120 of FIG. 2. In step 750, it is determined if a measured drain voltage $V_d$ is greater than a threshold voltage. In one embodiment, if the drain voltage of the measurable transistor is greater than the threshold voltage, step 752 is entered where a first logic level is produced signaling that the measurable element is in a first state. If it is found in step 750 that the drain voltage is not greater than the threshold voltage, step 754 is entered where a second logic level is produced signaling that the measurable circuit element is in a second state.

Some of the above embodiments have been described generally as utilizing transistors. These transistors are implemented through substantially any convenient transistor known in the art to provide the needed reactions including, but not limited to, FET, CMOS, BJT, MOSFET transistor and substantially any other transistor known in the art providing the functions to satisfy the conditions specified. Further, the foregoing description describes an apparatus for improving the accuracy of electronic circuits by accurately determining the state of a circuit element having a plurality of states with a different impedance for each state. The present invention is particularly effective in accurately determining the state of a degenerative zener diode, however, the apparatus and method of the present invention is equally applicable for determining the impedance of other devices or elements having variable impedance.

The foregoing descriptions of specific embodiments and best mode of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An apparatus for determining a state of a measurable circuit element having a plurality of states and a different impedance in each state, comprising:

a replicate circuit having a replicate circuit element and configured to generate a first test current through the replicate circuit element, the replicate circuit element having similar electrical characteristics as the measurable circuit element; and a trim determination circuit coupled with the replicate circuit, the trim determination circuit including the measurable circuit element and configured to generate a second test current dependent on the first test current through the measurable circuit element the trim determination circuit further including a scaled reference current source for generating a scaled reference current and a dependent measurable current source coupled with the scaled reference current source for generating a measured current whereby the amount of the measured current is a function of a first voltage drop across the measurable circuit element and the state of the measurable circuit element is determined by the difference between the scaled reference current and the measured current.

2. The apparatus as claimed in claim 1, wherein the replicate circuit includes a threshold current source for supplying a threshold current dependent on a voltage drop across the replicate circuit element, an adjustable test current source coupled with the replicate circuit element and the threshold current source for supplying the first test current and a reference current source coupled with the threshold current source for supplying a reference current whereby the difference between the reference current and the threshold current is zero when the first test current stabilizes at a certain value.

3. An apparatus according to claim 2, wherein the second test current is mirrored from the first test current and the scaled reference current is scaled from the reference current.

4. An apparatus according to claim 1, wherein the measurable circuit element includes a zener diode and the plurality of states include a trimmed state and an untrimmed state.

5. An apparatus according to claim 1, wherein the replicate circuit element includes an untrimmed Zener diode.

6. An apparatus for improving the accuracy of a circuit comprising a test current source for generating a test current, a measurable element coupled with the test current source for receiving the test current so as to result in a first voltage drop across the measurable element, a dependent measurable current source for generating a measurable current dependent on the first voltage drop across the measurable element, a scaled reference current source coupled with the dependent measurable current source for generating a scaled reference current and defining a measurable voltage between the dependent measurable current source and the scaled reference current source that is dependent on the difference between the measurable current and the scaled reference current, the measurable voltage indicating a state of the replicate element.

7. The apparatus as claimed in claim 6, further comprising an adjustable test current source for generating an adjustable test current that is mirrored by the test current source to generate the test current, a replicate element coupled with the adjustable test current source for receiving the adjustable test current, the adjustable test current source receiving a feedback for adjusting a second voltage drop across the replicate element.

8. The apparatus as claimed in claim 7, further comprising a dependent threshold current source for supplying a threshold current dependent upon the second voltage drop across the replicate element.

9. The apparatus as claimed in claim 8, further comprising a reference current source coupled with the adjustable current source for supplying a reference current.

10. The apparatus as claimed in claim 9, wherein the dependent threshold current source couples with the reference current source whereby the difference between the threshold current and the reference current dictating adjustments in the adjustable test current.

11. An apparatus according to claim 6, wherein the measurable circuit element includes a zener diode and the plurality of states include a trimmed state and an untrimmed state.

12. An apparatus according to claim 11, wherein the replicate circuit element includes an untrimmed zener diode.

13. An apparatus for improving the accuracy of a circuit, comprising a measurable circuit element having a plurality of states with a different impedance in each state whereby a test current received by the measurable circuit element results in a first voltage drop across the measurable element, a first amplifier having first and second inputs, the measurable element being coupled with the first input of the first amplifier for providing the first input with a measured voltage dependent on the first voltage drop, and a first sense voltage being supplied to the second input of the first amplifier, the first amplifier being configured to generate a first amplifier output dependent on the difference between the measured voltage and the first sense voltage, an adjustable test current source for generating an adjustable test current, a replicate element coupled with the adjustable test current source for receiving the adjustable test current so as to result in a second voltage drop across the replicate element whereby a voltage at one terminal of the replicate element is compared with a second sense voltage to provide a feedback to adjust the adjustable test current so that the first amplifier output indicates the state of the measurable element.

14. The apparatus as claimed in claim 13, wherein the test current is dependent on the adjustable test current.

15. The apparatus as claimed in claim 13, further comprising a second amplifier having a first and second input, the first input of the second amplifier being coupled with the replicate element for receiving a-first input voltage dependent on the second voltage drop across the replicate element, the second sense voltage being supplied to the second input of the second amplifier, the second amplifier being configured to generate a second amplifier output dependent on the difference between the first input voltage and the second sense voltage, and the adjustable test current source being coupled with the second amplifier and receiving the second amplifier output so that the the level of the adjustable test current is stabilized when the first input voltage equals the second sense voltage.

16. An apparatus according to claim 13, wherein the measurable circuit element includes a zener diode and the plurality of states include a trimmed state and an untrimmed state.

17. An apparatus according to claim 16, wherein the replicate circuit element includes an untrimmed zener diode.

18. An apparatus according to claim 13, wherein the first sense voltage is equal to the second sense voltage.

19. An apparatus for determining a state of a measurable circuit element having a plurality of states and a different impedance in each state, comprising:
a first circuit including a replicate circuit element having similar characteristics as the measurable circuit element, the first circuit being configured to generate a first test current through the replicate circuit element; and
a second circuit coupled with the first circuit and including the measurable circuit element, the second circuit being configured to generate a second test current dependent on the first test current through the measurable circuit element to result in a voltage drop across the measurable circuit element, the second circuit further being configured to generate a measured current dependent on the voltage drop and to output a voltage dependent on the difference between the measured current and a scaled reference current to indicate the state of the measurable element.

20. The apparatus of claim 19 further comprising an inverter coupled to the second circuit for receiving the voltage output from the second circuit to generate an output of "high" or "low" depending on the state of the measurable circuit element.

21. The apparatus of claim 20 wherein the first circuit is further configured to generate a threshold current depending on a voltage drop across the replicate circuit element and a reference current whereby the first test current is stabilized at a certain value when the threshold current is equal to the reference current.

22. The apparatus of claim 21 wherein the scaled reference current is scaled from the reference current.

23. The apparatus of claim 20 further comprising a first test current source for generating the first test current, a reference current source for generating the reference current, and a threshold current source for generating the threshold current, the first test current source, the reference current source, the threshold current source and the measurable circuit element being interconnected in a feedback loop such that the first test current is stabilized at a certain value when the threshold current is equal to the reference current.

24. The apparatus of claim 23 further comprising a measured threshold current source for generating the measured current and a scaled reference current source serially coupled with the measured threshold current source for generating the scaled reference current wherein the voltage is output from a circuit node between the measured threshold current source and the scaled reference current source to indicate the state of the measurable circuit element.

25. The apparatus of claim 24 wherein the first current source is implemented using a first test current transistor, the threshold current source is implemented using a threshold transistor, and the reference current source is implemented using a reference transistor, a source of the first test current transistor being connected to a first terminal of the replicate circuit element and to a gate of the threshold transistor, a gate of the first test current transistor being connected to the drain of the threshold transistor and to the source of the reference transistor, a source of the threshold transistor being connected to a second terminal of the replicate circuit element.

26. The apparatus of claim 25 further comprising a mirror transistor serially connected with the first test current transistor.

27. The apparatus of claim 25 wherein the second current source is implemented using a second test current transistor, the measured current source is implemented using a measured threshold transistor, and the scaled reference current source is implemented using a scaled reference transistor serially connected with the measured threshold transistor, a source of the second test current transistor being connected to a first terminal of the measurable circuit element and to a gate of the measured threshold transistor, a gate of the second test current transistor being connected to the first circuit, a source of the measured threshold transistor being connected to a second terminal of the measured circuit element.

28. The apparatus of claim 24 wherein the scaled reference current is a predetermined fraction of the reference current.

29. The apparatus of claim 19 wherein the measurable circuit element is a Zener diode having a trimmed or untrimmed state to be determined by the apparatus.

30. An apparatus for determining a state of a measurable circuit element having a plurality of states and a different impedance in each state, comprising:

a first circuit including a replicate circuit element having similar characteristics as the measurable circuit element, the first circuit being configured to generate a first test current through the replicate circuit element, the first test current being stabilized when a voltage at one terminal of the replicate circuit element is equal to a first reference voltage; and a second circuit coupled with the first circuit and including the measurable circuit element, the second circuit being configured to generate a second test current dependent on the first test current through the measurable circuit element and to generate an output dependent upon the difference between a measured voltage at one terminal of the measurable circuit element and a second reference voltage associated with the first reference voltage, the output indicating the state of the measurable element.

31. The apparatus of claim 30 wherein the second reference voltage is proportional to the first reference voltage.

32. The apparatus of claim 31 wherein the second reference voltage is equal to the first reference voltage.

33. The apparatus of claim 30 wherein the second circuit outputs a "high" or "low" depending on the state of the measurable circuit element.

34. The apparatus of claim 30 wherein the second test current is equal to the first test current.

35. The apparatus of claim 34 wherein the second test current is a multiple of the first test current.

36. The apparatus of claim 30 further comprising a first current source serially connected with the replicate circuit element for generating the first test current, a first amplifier having a first input connected to the one terminal of the replicate circuit element, a second input connected to the first reference voltage, and an output connected to a control terminal of the first current source.

37. The apparatus of claim 36 wherein the first current source is implemented using a transistor and the control terminal is the gate of the transistor.

38. The apparatus of claim 37 further comprising a second current source serially connected with the measurable circuit element for generating the second test current, a second amplifier having a first input connected between the measurable circuit element and the second test current, and a second input connected to the second reference voltage.

39. The apparatus of claim 38 further comprising an inverter coupled to an output of the second amplifier, the inverter outputting a "high" or "low" depending on the state of the measurable circuit element.

* * * * *